United States Patent [19]

Veerman et al.

[11] Patent Number: 4,616,101
[45] Date of Patent: Oct. 7, 1986

[54] VENTILATION PANEL FOR ELECTROMAGNETIC SHIELDING

[75] Inventors: Frederik W. J. Veerman; Jan H. Jonker, both of Hilversum, Netherlands

[73] Assignee: U.S. Philips Corporation, New York, N.Y.

[21] Appl. No.: 671,662

[22] Filed: Nov. 15, 1984

[30] Foreign Application Priority Data

Jul. 13, 1984 [NL] Netherlands .......................... 8402224

[51] Int. Cl.[4] ............................................... H05K 9/00
[52] U.S. Cl. ............................... 174/35 MS; 361/383; 361/424
[58] Field of Search ..................... 174/35 GC, 35 MS; 361/383, 384, 424; 98/29; 219/10.55 D

[56] References Cited

U.S. PATENT DOCUMENTS 2,925,457  2/1960  Lindgren ........................ 174/35 MS
3,546,359 12/1970  Ciccarelli et al. .............. 174/35 MS
3,580,981  5/1971  Lamp et al. .................... 174/35 MS
3,584,134  6/1971  Nichols et al. ................. 174/35 MS Primary Examiner—Arthur T. Grimley
Assistant Examiner—D. A. Tone
Attorney, Agent, or Firm—David R. Treacy

[57] ABSTRACT

A ventilation panel comprising a rectangular grating for electromagnetic shielding which is arranged in a rectangular frame and has a cell structure. The grating is resiliently enclosed in the frame by means of a comb-shaped mounting spring which also holds the complete ventilation panel resiliently clamped between two walls of a box with electrical components. The mounting spring further provides an electromagnetic shielding at the area of the separation between the ventilation panel and wall portions of the box. The ventilation panel is used in racks for data-processing apparatus, such as public telephone exchanges.

13 Claims, 8 Drawing Figures 4,616,101

VENTILATION PANEL FOR ELECTROMAGNETIC SHIELDING

BACKGROUND OF THE INVENTION

The invention relates to a ventilation panel comprising a rectangular plate-shaped grating for shielding electromagnetic radiation arranged in a rectangular frame and composed of cells.

A plate-shaped grating of the kind mentioned in the opening paragraph is known from U.S. Pat. No. 3,821,463. This grating may be made, for example, of aluminium strips absorbing elelctromagnetic radiation. According to p. 95 and 96 of a catalogue published by "Metex Electronic Shielding Group" (entitled: "EMI/RFI Shielding Handbook and Catalogue") in 1977, such a grating can be clamped in a frame having a U-shaped cross-section so that a unit serving as a ventilation panel is obtained. For this purpose, the frame is provided, for example, with projections which penetrate into the material of the grating. The panel thus formed can then be secured by means of screws extending through the frame and the grating on a wall of a device (box) which has to be electromagnetically shielded while maintaining the cooling by natural convection of the heat-producing electrical components present in the box. Between a wall of the said box and the ventilation panel there is clamped a further electromagnetic shield.

A disadvantage of the known ventilation panel is that tolerances of the U-shaped frame and the grating in a direction at right angles to the plane of the grating have to be neutralized by a considerable elastic deformation of the flanges of the comparatively rigid U-shaped frame, while plastic deformation of the cell structure has to ensure that a sufficiently large pressure force is obtained between the frame and the grating. The frame and the grating are consequently subjected to a comparatively high mechanical load. The invention has for its object to provide a ventilation panel in which the above noted disadvantage is avoided.

SUMMARY OF THE INVENTION

A ventilation panel according to the invention is characterized in that the grating is clamped on at least two opposite sides under resilient force of a comb-shaped mounting spring secured to the frame between a flange of the frame of L-shaped cross-section and resilient supporting feet formed at the mounting spring.

Due to the resilient supporting feet, the ventilation panel has in a direction at right angles to the plane of the grating a comparatively low sensitivity to tolerances of the frame and the grating. The resilient action of the supporting feet is sufficient to neutralize deviations in dimensions of the frame and the grating.

A further embodiment of a ventilation panel, which can be manufactured in a simple and inexpensive manner in mass production, is characterized in that the mounting spring is stamped and bent from one strip of metal.

A preferred embodiment of the ventilation panel is characterized in the the supporting feed of the mounting spring have a V-shaped cross-section with a flange which engages the frame and whose height is greater than the height of the relevant flange of the L-shaped frame to which the mounting spring is secured. Due to the fact that the mounting spring extends beyond the flange of the L-shaped frame which is at right angles to the plane of the grating, the mounting spring serves at the same time as an electromagnetic shield at the separation surface between the ventilation panel and the side wall of a box on which the ventilation panel is secured.

A still further embodiment of the ventilation panel is characterized in that the mounting spring is provided with lugs which are secured to a wall of an electromagnetically shielded box. Since the lugs can be stamped simultaneously with the supporting feet from metal strips, the ventilation panel can be secured without additional components and operations being required.

BRIEF DESCRIPTION OF THE DRAWINGS

The invention will be described more fully with reference to the drawings, in which.

DETAILED DESCRIPTION OF THE PREFERRED EMBODIMENT

Figure 1:
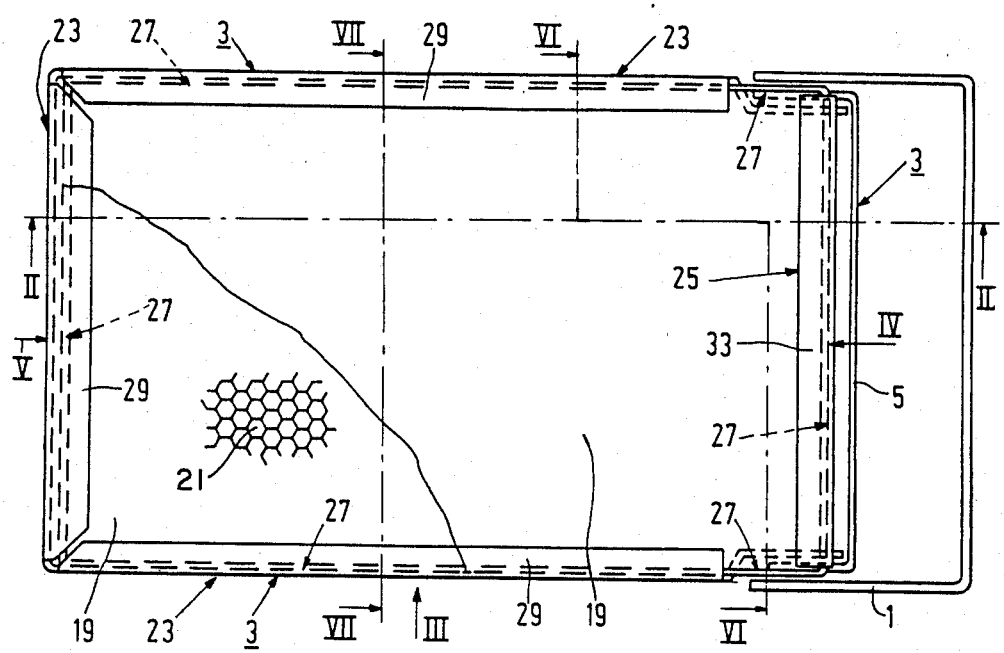
FIG. 1 is a plan view of a ventilation panel secured on a box.

The device illustrated in FIGS. 1, 2, 3 and 8 comprises a metal vertical column 7 of U-shaped cross-section in which a box 3 is secured in a usual manner, which is therefore not described further. The box 3 has a metal back wall 5 of U-shaped cross-section, to which two metal parallel side walls 7 and 9 are secured. On its upper side the box 3 is limited by a metal plate 11 having ventilation openings 13. The plate 11 forms a connection between the side walls 7 and 9. On its lower side the box 3 is limited by a metal plate (not shown) similar to the plate 11. Vertically extending panels 15 with heat-producing electrical components 17 are arranged in the box 3. Cooling by natural convection prevents the components 17 from being subjected to an excessively high temperature. A number of juxtaposed boxes 3 can be secured to the vertical column 1. The box 3 and the column 1 together constitute a rack. Such racks are used especially in data-processing apparatus, such as are frequently utilized, for example, in public telephone exchanges.

It is usual to screen boxes comprising electrical components which have to be cooled, by means of gratings of the kind described, for example, in U.S. Pat. No. 3,821,463. Such gratings prevent electromagnetic interference from the inside and from the outside while maintaining a ventilation possibility. In the present case, a rectangular grating 19 with cells 21 constituted by aluminium strips (see FIG. 1) is arranged in a rectangular metal frame 23, which has an L-shaped cross-section and is bent into the shape of a U. A metal connection beam 25 of L-shaped cross-section is secured to the frame 23 by means of a mounting spring 27. The grating 19 is clamped between a flange 29 of the frame 23 and supporting feet 31 formed at the mounting spring 27 as well as between a flat flange 33 of the connection beam 25 and the supporting feet 31. The mounting spring 27 has a rectangular shape and is stamped from one strip of metal which is bent rectangularly four times, after which the two ends are connected to each other by means of rivet connections through the connection beam 25. Furthermore, the supporting feet 31 are stamped in the metal strip of the mounting spring 27 and are than bent into the shape of a V so that a comb-shaped construction is obtained.

The mounting spring 27 is further provided with stamped securing lugs 35. A flat flange 37 of the mounting spring 27 of V-shaped cross-section is secured on three sides by means of rivet connections 39 to a flat flange 41 of the frame 23. The flanges 29 and 41 of the frame 23 are at right angles to each other and thus form the L-shaped cross-section. The flat beam 37 of the mounting spring 27 of V-shaped cross-section further engages a flat flange 43 of the connection beam 25. The flanges 33 and 43 of the connection beam 25 arranged at right angles to each other together constitute an L-shaped cross-section. By means of rivet connections (not shown), the limb flange 37 of the mounting spring 27 is secured to the flange 43 of the connection beam 25.

Figure 2:
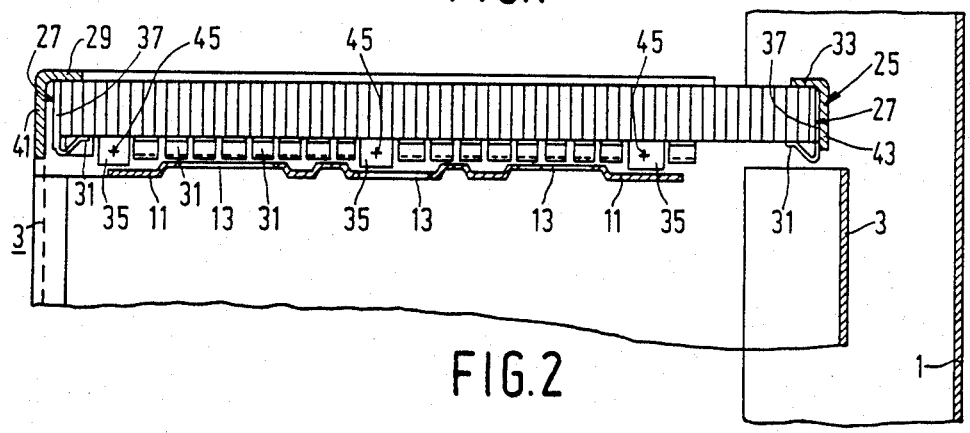
FIG. 2 is a sectional view taken along the line II—II in FIG. 1.
Figure 3:
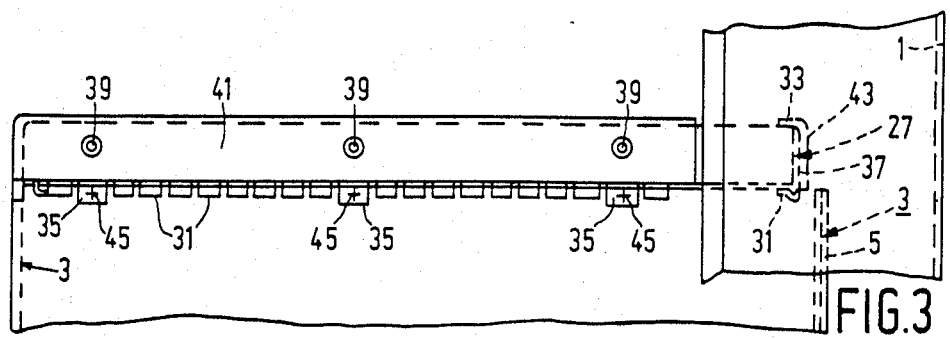
FIG. 3 is a side elevation in the direction of the arrow III in FIG. 1.
Figure 4:
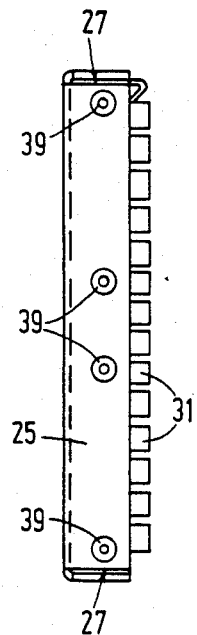
FIG. 4 is a partial side elevation in the direction of the arrow IV in FIG. 1.
Figure 5:
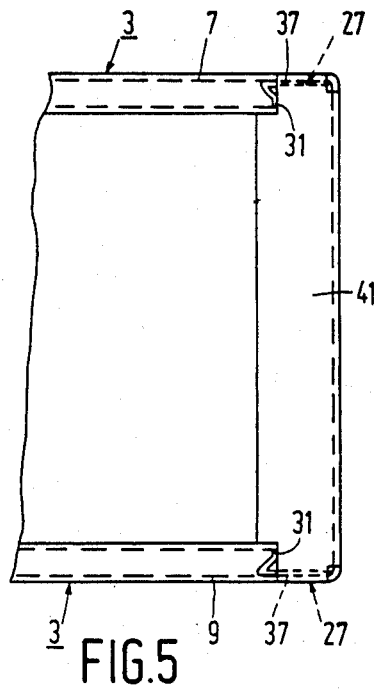
FIG. 5 is a side elevation in the direction of the arrow V in FIG. 1.
Figure 6:
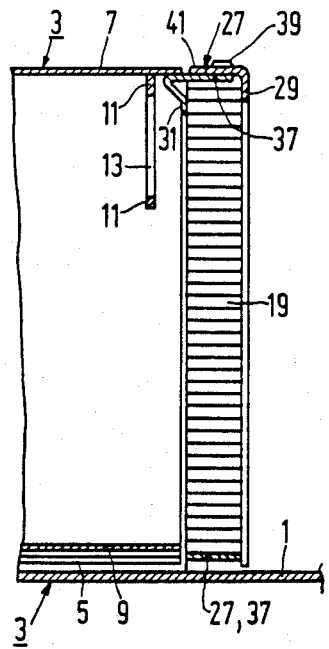
FIG. 6 is a sectional view taken along the line VI—VI in FIG. 1.

Although the flange 37 of the mounting spring 27 is located in FIG. 2 on the lefthand side of the ventilation panel at a certain distance from the flange 41 of the frame 23, this is not necessary. An advantage is that any wall portions of a box 3 can be inserted into the gap thus formed. However, the flange 41 may also be secured to the flange 37 by means of rivet connections without a gap.

It appears from FIGS. 2, 3, 4, 5 and 6 that the supporting feet 31 extend beyond the lower end face of the grating 19. As a result, the ventilation panel can be resiliently clamped between the walls 7 and 9 of the box 3 (see FIG. 5) on two opposite sides of the panel 1, and the feet extend beyond the separation between the ventilation panel and the side walls 7 and 9. Since the gaps between the supporting feet 31 of the comb-shaped mounting spring 27 are dimensioned so that electromagnetic radiation cannot enter or emanate, the mounting spring 27 therefore also serves as an electromagnetic shield (by contacting). The mounting spring 27 therefore has a threefold function, i.e.: a mounting fucntion for the grating 19, a mounting function for the complete ventilation panel by resilient clamping between the side walls 7 and 9 of the box 3 and, finally, as stated, a shielding function.

Figure 7:
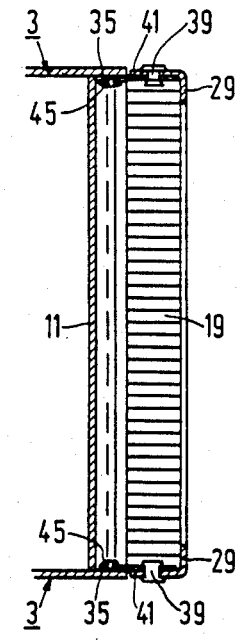
FIG. 7 is a sectional view taken along the line VII—VII in FIG. 1.
Figure 8:
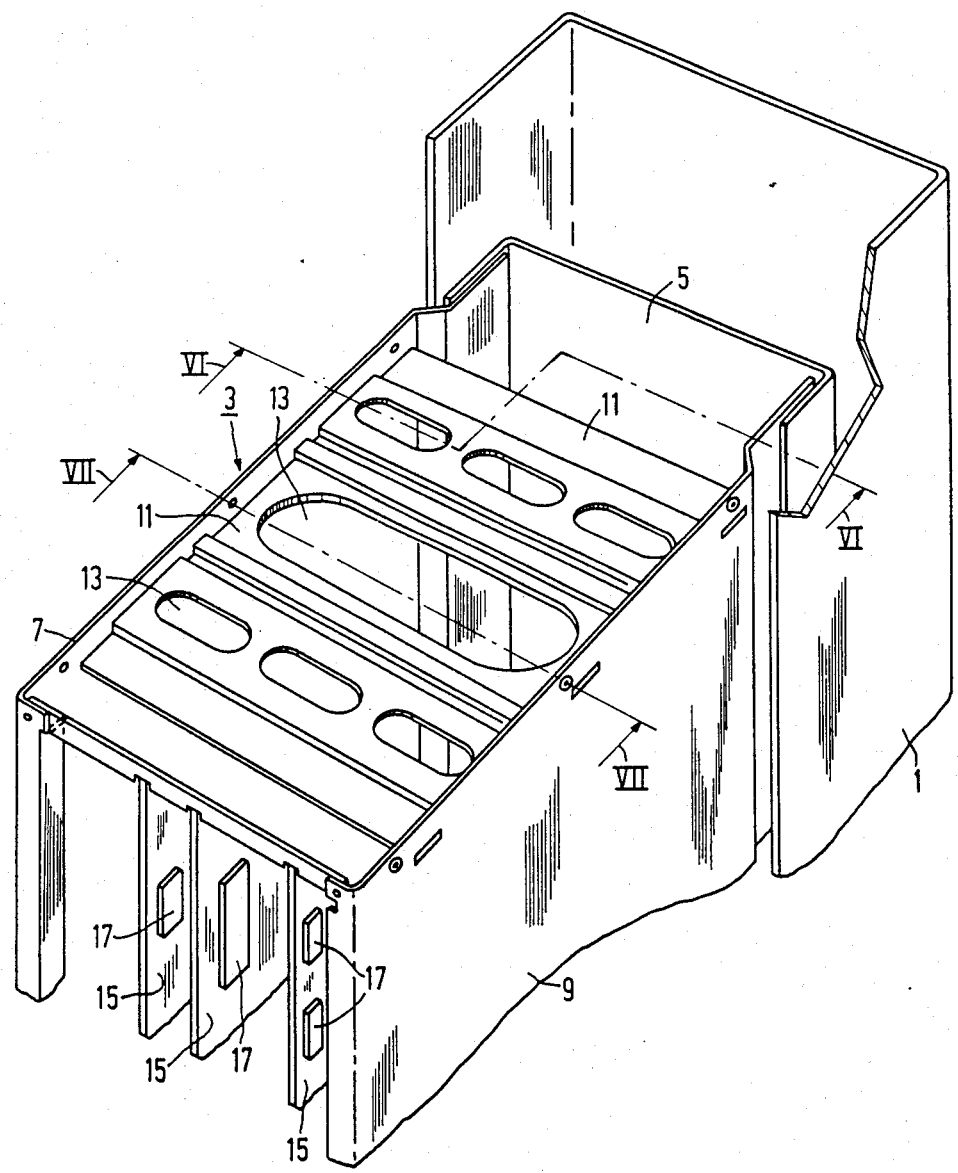
FIG. 8 is a perspective view of a box on which the ventilation panel is secured.

The securing lugs 35 also are resiliently clamped between the walls 7 and 9 of the box 3. As appears from FIG. 7, the securing lugs 35 can be provided with openings 45. If also the side walls 7 and 9 are provided with openings in register with the openings 45, the securing lugs 35 can be secured to the side walls 7 and 9 by means of a screw connection (shown diagrammatically in FIGS. 2 and 3).

Strictly speaking, the mounting spring 27 need be secured to the frame 23 only on two opposite sides. The complete ventilation panel need be resiliently clamped only on two opposite sides between two walls of a box. The remaining gaps can be electromagnetically shielded with a shielding material known per se. The U-shaped frame 23, which is secured to the connection beam 25 by means of the mounting spring 27, may alternatively take the form of a rectangular frame. The separate connection beam 25 is dispensed with in this case. Although the mounting spring 27 is in the form of a rectangular construction, it is possible to use four separate mounting springs, i.e. one for each of the sides of the rectangle. In this case, the mounting spring is not four times bent rectangularly at its corners. The mounting spring may then be stamped from one strip of metal, it is true, but it has then to be subdivided into four separate mounting springs by three cutting operations. The complete ventilation panel may also be resiliently clamped between a front wall and a back wall of the box, instead of on the two opposite side walls of the box. In this case, the box must have a front and a back wall or wall portion with an overlap extending above the level of the plate 11.

In the present case, the grating 19 comprises one layer. The dimensions of the cells in the grating 19, especially the ratio between the distance of the cell walls (hexagonal cell) and the height of the cell, are chosen so that a sufficient electromagnetic shielding is obtained while maintaining a sufficient ventilation. However, it is also possible to use a grating comprising two layers, as described in U.S. Pat. No. 3,821,463. The material chosen for the grating may be, for example, aluminium, steel or a copper alloy, such as bronze.

Due to the resilient action of the mounting spring 27 both in a direction parallel to the plane of the grating 19 and in a direction at right angles to the plane of the grating 19, the construction of the box 3 and the ventilation panel has a comparatively low sensitivity to deviations in dimensions, as a result of which the manufacture can take place at low cost. In general, deviations in dimensions of constructions of the kind described give rise to a serious problem because of the comparatively large dimensions of the boxes and ventilation panels. The invention has considerably reduced the problems resulting therefrom.

What is claimed is:

1. A ventilation and electromagnetic shielding panel comprising a rectangular frame having two pairs of opposite sides, and situated therein a rectangular plate-shaped grating composed of cells, wherein said frame sides each have an L-shaped cross-section formed by top and side flanges, said panel further comprising a mounting spring having a body part secured to said side flange of said frame and a plurality of resilient comb-shaped feet, said grating being resiliently clamped between said feet and said top flange of said frame.

2. A panel according to claim 1 wherein said grating has a peripheral edge, said spring has a rectangular body part which surrounds said grating edge and is situated within said rectangular opening of frame.

3. A panel according to claim 1 wherein said mounting spring comprises a stamped and bent single strip of metal.

4. A panel according to claim 1 wherein said grating has a thickness dimension parallel to said side flange of said frame, and wherein said body part of said spring has height greater than the corresponding height of the side flange of the frame to which it is secured.

5. A panel according to claim 4 wherein said feet of said spring define a V-shape in cross-section with one leg of the V co-extensive with said body part of the spring and the other leg of the V engaging said grating.

6. A panel according to claim 1 further comprising a box having walls which define a rectangular opening into which said panel is situated, said panel further comprising fastening means for securing said spring to at least one of said walls of said box.

7. A panel according to claim 6 wherein said box further comprises plate covering said rectangular opening said plate defining therein a pluarlity of ventilation openings, said panel being situated to overlie said plate.

8. A ventilation and electromagnetic shielding panel comprising a frame formed of walls which define an opening and situated therein a generally planar grating composed of cells which define ventilation apertures extending traversely of the plane of said grating, said panel further comprising a mounting spring having a body part secured to said side walls of said frame and a plurality of resilient feet spaced slightly apart from each other, said grating being resiliently clamped between said feet and said walls of said frame.

9. A panel according to claim 8 wherein said frame walls define an opening of predetermined shape and said panel has a corresponding shape and is situated in said opening, said frame walls comprise a flange part extending transversely thereof and parallel to the plane of said grating, and said grating is resiliently clamped between said flange and said feet of said spring.

10. A panel according to claim 9 wherein said frame walls are L-shaped in cross-section, one leg of the L being a flange extending transversely of the opening and parallel to the plane of said grating.

11. A panel according to claim 8 wherein said feet are spaced apart from each other a predetermined distance for preventing passage of electromagnetic radiation between said feet.

12. A panel according to claim 8 wherein said frame opening is rectangular and said grating has corresponding rectangular shape which fully overlies said opening for providing electromagnetic shielding to the space within said opening.

13. A panel according to claim 8 wherein said spring has a body part defining a rectangle corresponding to that of the frame and is situated and secured therein, and said grating has a similar rectangular shape and is situated and secured within said spring body part, said spring feet passing resiliently against said grating urging it to remain situated within said frame.

* * * * *

UNITED STATES PATENT AND TRADEMARK OFFICE
CERTIFICATE OF CORRECTION

PATENT NO. : 4,616,101
DATED : October 7, 1986
INVENTOR(S) : FREDERIK W. J. VEERMAN ET AL It is certified that error appears in the above-identified patent and that said Letters Patent is hereby corrected as shown below:

IN THE CLAIMS

Claim 7, column 5, line 3, change "pluarlity" to

--plurality--.

Claim 12, column 6, line 10, after "has" insert --a--.

Claim 13, column 6, line 19, change "passing" to

--pressing--.

Signed and Sealed this

Twenty-third Day of December, 1986

Attest:

DONALD J. QUIGG

*Attesting Officer*      *Commissioner of Patents and Trademarks*